US008610481B2

(12) United States Patent
Lorenzo Pena

(10) Patent No.: US 8,610,481 B2
(45) Date of Patent: Dec. 17, 2013

(54) DISCRETE SIGNAL CONSOLIDATION DEVICE AND METHOD AND AIRCRAFT WITH SAID DEVICE

(71) Applicant: Eads Construcciones Aeronauticas, S.A., Madrid (ES)

(72) Inventor: Eladio Lorenzo Pena, Madrid (ES)

(73) Assignee: EADS Construcciones Aeronauticas, S.A., Madrid (ES)

( * ) Notice: Subject to any disclaimer, the term of this patent is extended or adjusted under 35 U.S.C. 154(b) by 0 days.

(21) Appl. No.: 13/671,655

(22) Filed: Nov. 8, 2012

(65) Prior Publication Data

US 2013/0113538 A1 May 9, 2013

(30) Foreign Application Priority Data

Nov. 8, 2011 (ES) .................................. 201131792

(51) Int. Cl.
*G06F 1/04* (2006.01)

(52) U.S. Cl.
USPC ............................. 327/291; 327/298; 327/200

(58) Field of Classification Search
USPC ......... 327/291, 293–294, 298–299, 141–142, 327/144, 198–201
See application file for complete search history.

(56) References Cited

U.S. PATENT DOCUMENTS

| 2,854,590 | A | | 9/1958 | Wolfe | |
|---|---|---|---|---|---|
| 3,042,813 | A | | 7/1962 | Johnson | |
| 4,550,308 | A | * | 10/1985 | Tokura et al. | 341/167 |
| 5,721,511 | A | * | 2/1998 | Lee | 327/540 |
| 8,022,681 | B2 | * | 9/2011 | Gurcan | 323/283 |

FOREIGN PATENT DOCUMENTS

GB 2175264 11/1986

OTHER PUBLICATIONS

European Search Report, Mar. 7, 2013.

* cited by examiner

*Primary Examiner* — An Luu
(74) *Attorney, Agent, or Firm* — Greer, Burns & Crain Ltd.

(57) ABSTRACT

A device and a method for eliminating transitions in discrete signals. The working of the device and method is based on allowing the charge of a capacitor with one state when the state opposite the state to which it has been assigned is produced and allowing their discharge through a corresponding capacitor when their state is active. The signal is advantageously consolidated without needing processors or programs, is very simple, there is increased reliability, and the device can very easily be integrated in any sensor, such as those used in aircraft.

14 Claims, 6 Drawing Sheets

DISCRETE SIGNAL CONSOLIDATION DEVICE AND METHOD AND AIRCRAFT WITH SAID DEVICE

BACKGROUND OF THE INVENTION

The present invention relates to the use of discrete signals passing from one state to another changing several times until the signal is stable, these changes being inherent to the physical phenomenon which is being measured.

The main technical problem is consolidating these signals before making decisions with them, such that actions which could cause damage are not caused to be taken. In particular, damage can be caused to the aircraft itself when making decisions which, by not being consolidated, can be dangerous or inappropriate for operating the aircraft, such as for example changing flight parameters when the aircraft is very close to the ground without having the state of already being on the ground consolidated.

The usual form of consolidation in the state of the art consists of analysing the signal and not allowing the state change until the signal is stable for more than a certain time, the consolidation time, which will be that suitable for the physical phenomenon which is being measured.

This is conventionally done with a digital process in the computing devices receiving said signals, but in some cases it would be very convenient to have said signals already filtered, such that they can be used directly.

SUMMARY OF THE INVENTION

The present invention relates to a two-state discrete signal consolidation device. Such a device is defined in a first inventive aspect, said device comprising:

switching means (Q1, Q2) controlled by the discrete signal, capacitive means (C1,C2) for each state, said capacitive means connected to the switching means such that they are charged when the other state is produced, and resistive means (R1,R2) for each state, said resistive means connected to the switching means and to the capacitive means of the corresponding state, such that the corresponding capacitive means are discharged through them when the corresponding state is produced, stable state detection signal generating means for each state, said means suitable for generating a stable state detection signal in two excluding modes a) or b), mode a) being when the discharge level of the corresponding capacitive means reaches a detection level such that the discharge time necessary for reaching it is equal to or greater than the consolidation time of the corresponding state, and mode b) being when the charge level of the corresponding capacitive means reaches a detection level such that the charge time necessary for reaching it is equal to or greater than the consolidation time of the corresponding state, consolidated signal generating means suitable for generating a discrete signal, the state of which corresponds to that of the last stable state detection signal generated in either of the two modes a) or b).

The consolidation device is thus capable of working in two different modes, mode a) in which the decision is made at the time of discharging the corresponding capacitive means, and mode b) in which said decision is made at the time of charging.

A method for consolidating a two-state discrete signal is defined in a second aspect of the invention, said method comprising the following steps:

allowing the charge of capacitive means associated with one state when the opposite state is produced, through switching means controlled by the discrete signal, allowing the discharge of said capacitive means through resistive means associated with said state when said state is active through said switching means, generating a stable state detection signal corresponding to one state either when the discharge level of the capacitive means corresponding to said state reaches a detection level such that the discharge time necessary for reaching it is equal to or greater than the consolidation time of said state, or when the charge level of the capacitive means corresponding to said state reaches a detection level such that the charge time necessary for reaching it is equal to or greater than the consolidation time of said state, generating a consolidated signal with a state corresponding to that of the last stable state detection signal generated.

Like the consolidation device of the first inventive aspect, the method for consolidating a two-state discrete signal can also be implemented in two different modes, one mode in which the decision is made at the time of discharging the corresponding capacitive means, and one mode in which said decision is made at the time of charging.

Lastly, an aircraft comprising at least one two-state discrete signal consolidation device according to the first inventive aspect is presented in a third inventive aspect.

All the features included in this document (including the claims, the description and the figures) and/or all the steps of the described method can be combined in any way, with the exception of combinations of mutually excluding features and/or steps.

BRIEF DESCRIPTION OF THE DRAWINGS

These and other features and advantages of the invention will be more clearly shown from the following detailed description of a preferred embodiment given only by way of illustrative and non-limiting example in reference to the attached drawings.

DETAILED DESCRIPTION OF THE PREFERRED EMBODIMENTS

The present detailed description of the invention corresponds to the embodiment of the so-called stable state detection signal generation mode a).

The working of this embodiment is based on allowing the charge of the capacitive means, there being two capacitors in this embodiment, one for state 0 (C2) and another for state 1 (C1), when the opposite state to the state to which it has been assigned is produced, and allowing their discharge through the resistive means, respective resistors (R2, R1) in this embodiment, when their state is active.

Therefore, each resistor (R2, R1) will only be able to be discharged enough to reach a determined discharge level when its corresponding state remains stable for more than a corresponding discharge time. Given that the discharge of each resistor will be imposed by the corresponding RC constant (R1C1, R2C2), the values of R (R1, R2), C (C1, C2) and the discharge level are selected such that the discharge time necessary for reaching said discharge level is equal to or greater than the consolidation time of the corresponding state.

Advantageously, each discharge level is detected with a trigger at a suitable V_REF level.

Advantageously, if the consolidation time is to be exactly RC the trigger will be at 37% of the charge voltage. The consolidation time will be proportional to RC in alternative embodiments.

Figure 1:
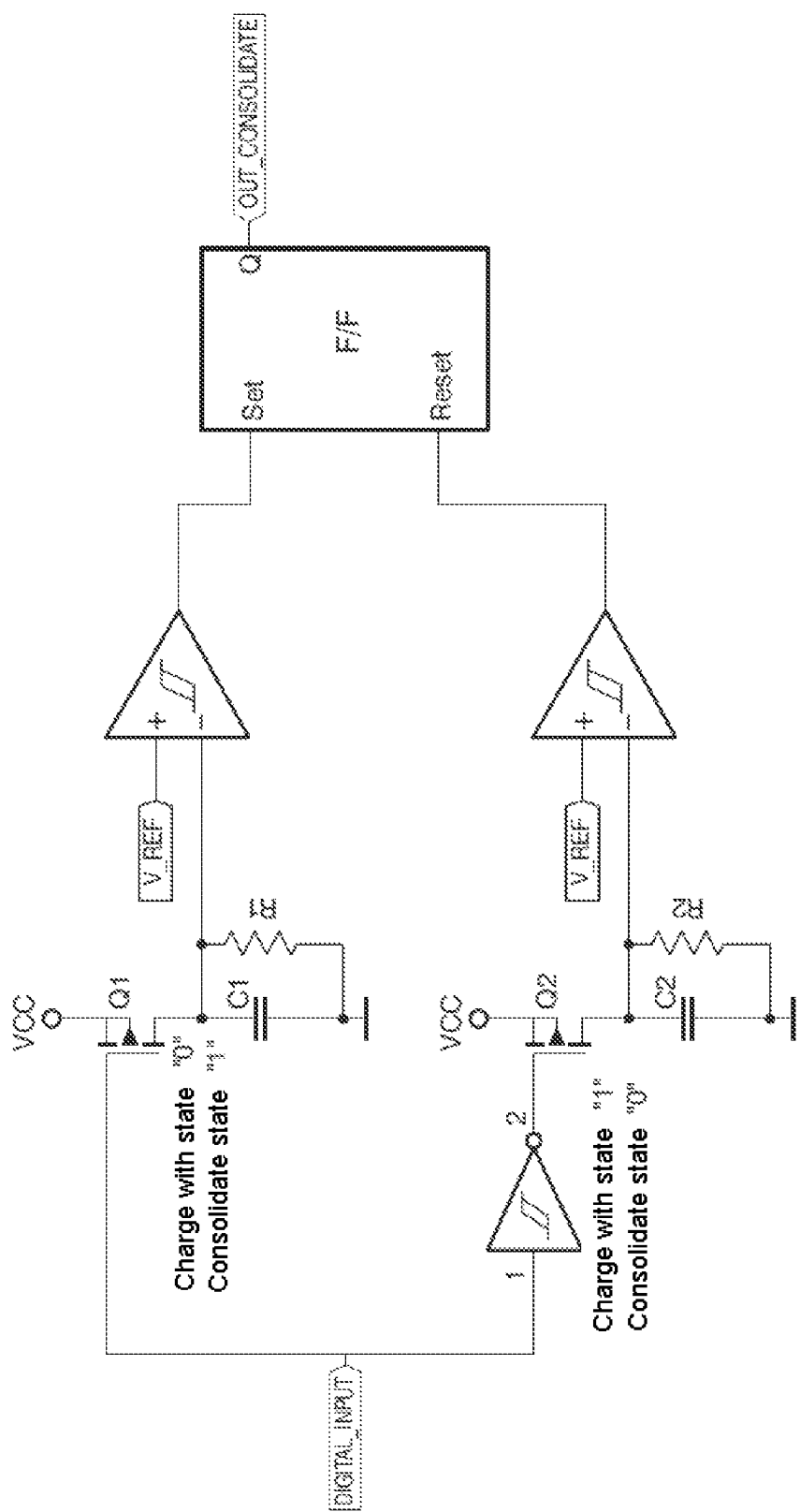
FIG. 1 shows a first embodiment of the invention.

The switching means are transistors and the stable state is established by operating a set/reset flip-flop for obtaining the consolidated signal in a first embodiment according to FIG. 1. In another embodiment, the switching means are conducting diodes.

The mentioned device can be carried out in other forms maintaining the same operating principle; it has the advantage of consolidating the signal without needing processors or programmes, is very simple, increasing its reliability, and can very easily be integrated in any sensor.

It is also possible to make the consolidation times different for state 0 and state 1, which would be desirable because there are processes in which instabilities of the physical phenomenon being measured last longer in one state than in the other.

Figure 2:
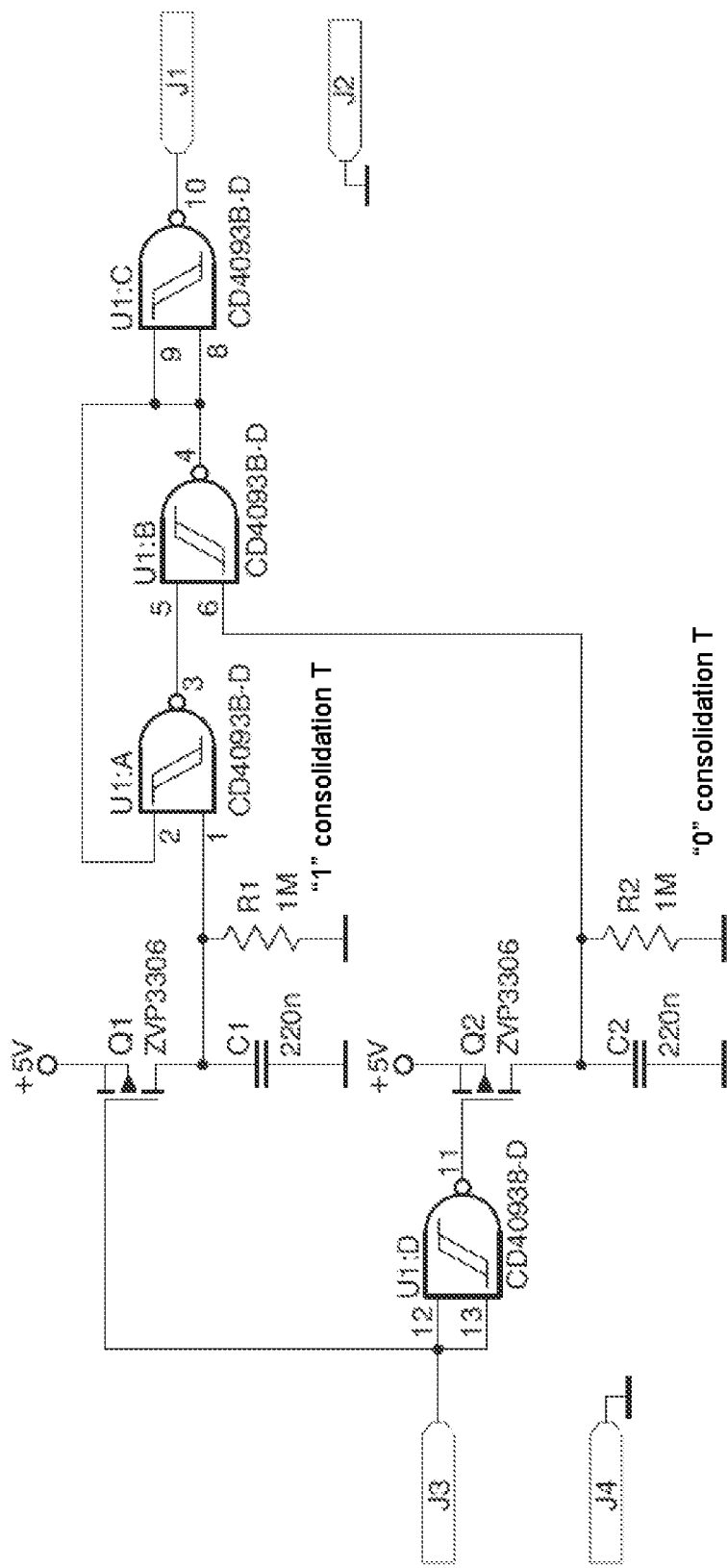
FIG. 2 shows a second embodiment of the invention.

FIG. 2 shows an alternative embodiment of the device. Simulation data have been obtained for this embodiment, shown in FIGS. 3 to 9, with a 200 ms consolidation time equal for states 0 and 1, performed with a circuit using only 7 components.

The transistors (Q1, Q2) conduct when there is a zero at the gate, so a NAND gate (U1:D) has been placed as an inverter before Q2 so it is activated when there is a 1 at the input, Q1 thus charges the capacitor C1 when there is a state 0 and Q2 charges C2 when there is a state 1 at the input (J3).

In this circuit the triggers are integrated in the NAND gates themselves. The U1:A and U2:B gates are used as an S/R flip-flop, active state at zero, and the trigger value is approximately 40% VCC, in this case 5V, so the consolidation time is somewhat less than RC.

Figure 3:
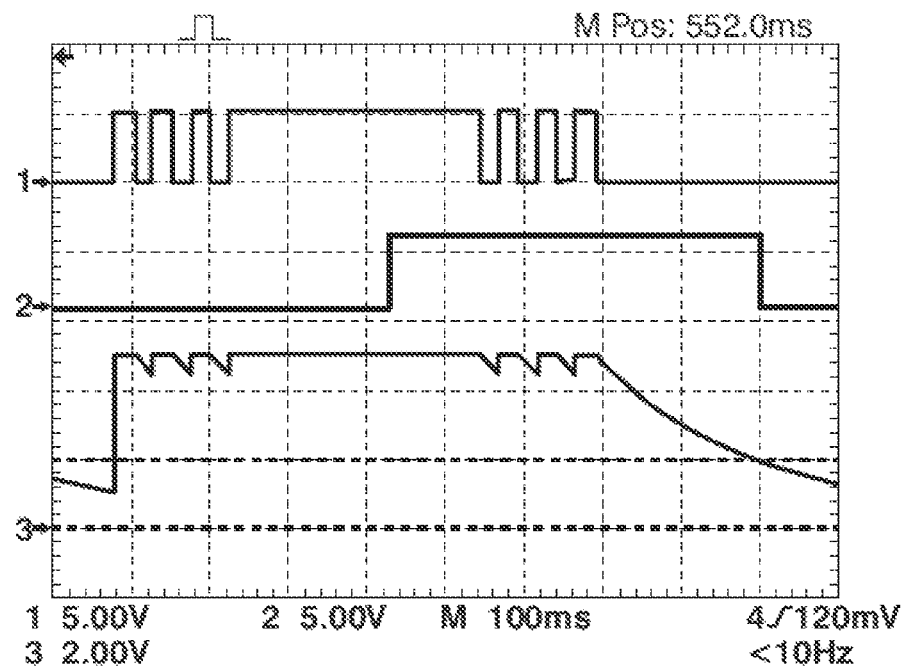
FIG. 3 shows consolidation of state 0.

FIG. 3 shows how the capacitor is charged every time there is a 1 (signal 1 in FIG. 3) at the input for consolidating state 0, preventing it from discharging to the trigger value (signal 3 in FIG. 3), and when it is below the trigger value, it changes the output to state 0 (signal 2 in FIG. 3).

Figure 4:
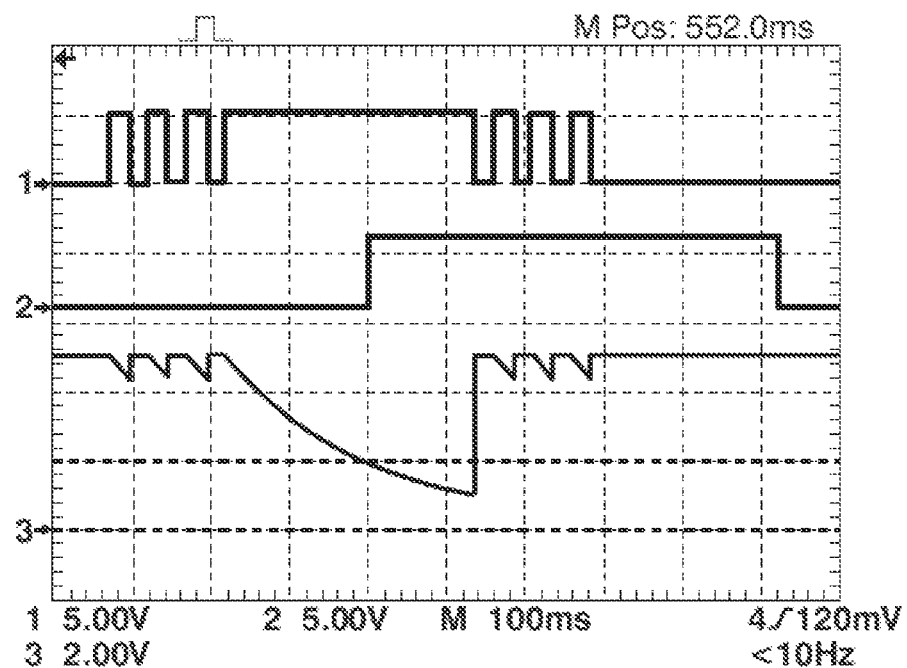
FIG. 4 shows consolidation of state 1.
Figure 5:
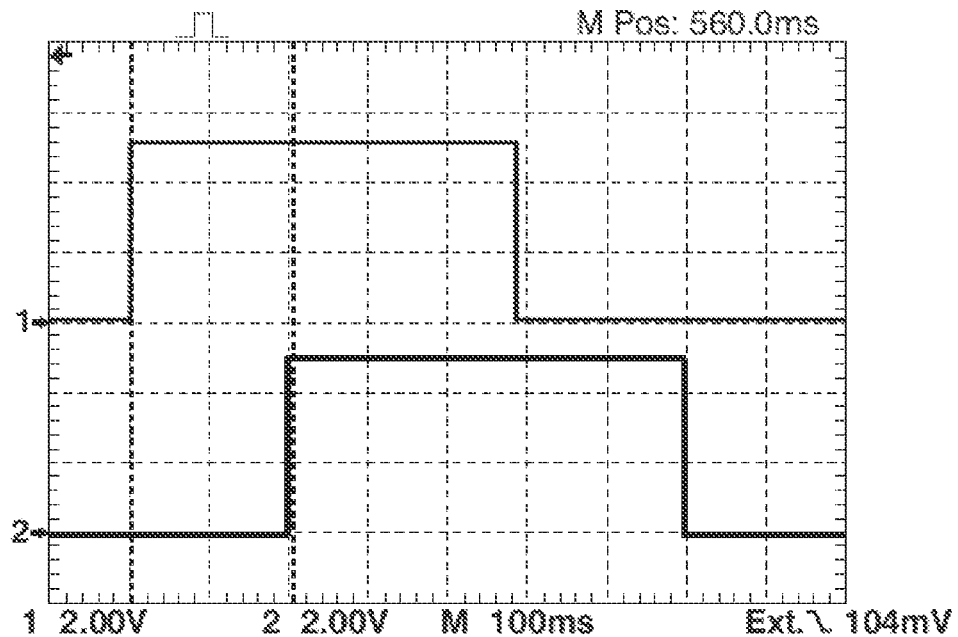
FIG. 5 shows a clean input signal and the corresponding consolidated signal.
Figure 6:
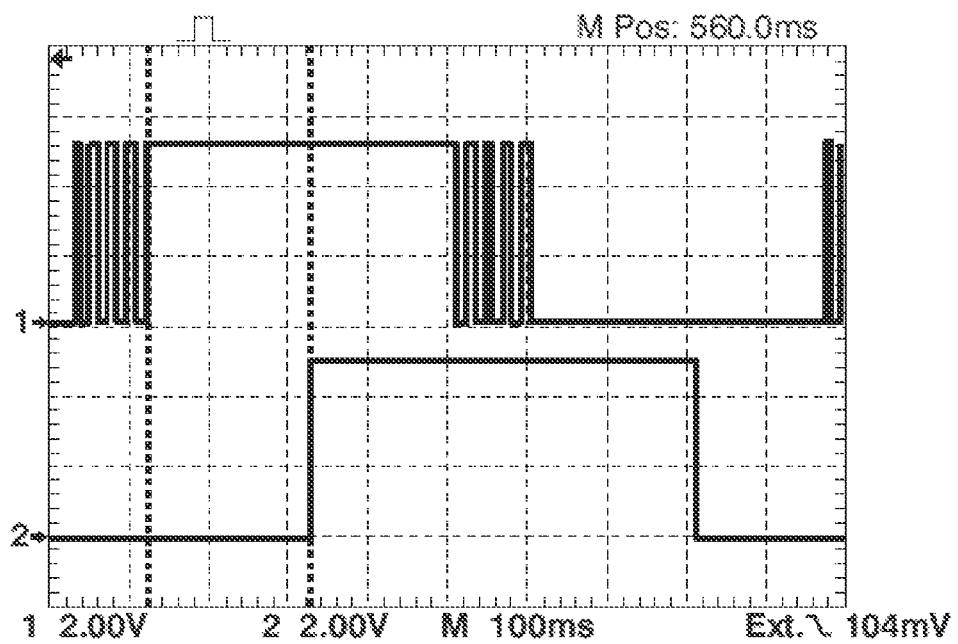
FIG. 6 shows an input signal with instabilities and the corresponding consolidated signal.
Figure 7:
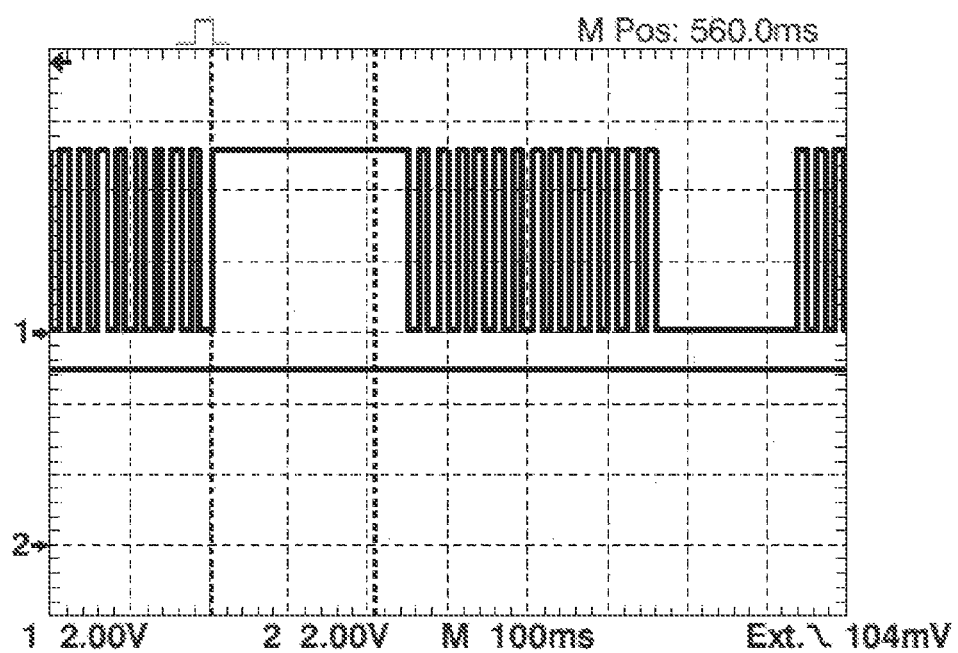
FIG. 7 shows an input signal with instabilities and insufficient state 0 time and the corresponding consolidated signal.
Figure 8:
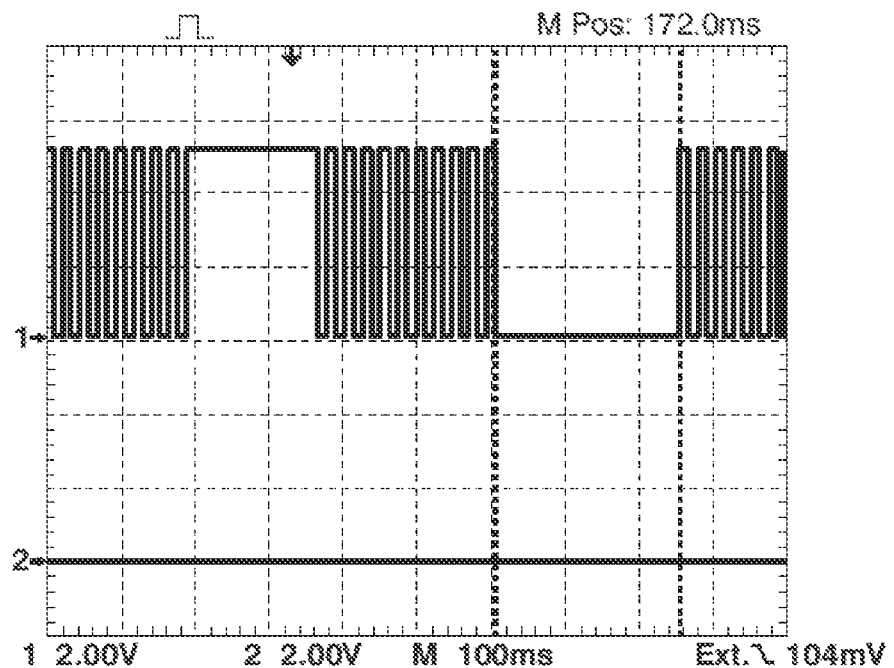
FIG. 8 shows an input signal with instabilities and insufficient state 1 time and the corresponding consolidated signal.
Figure 9:
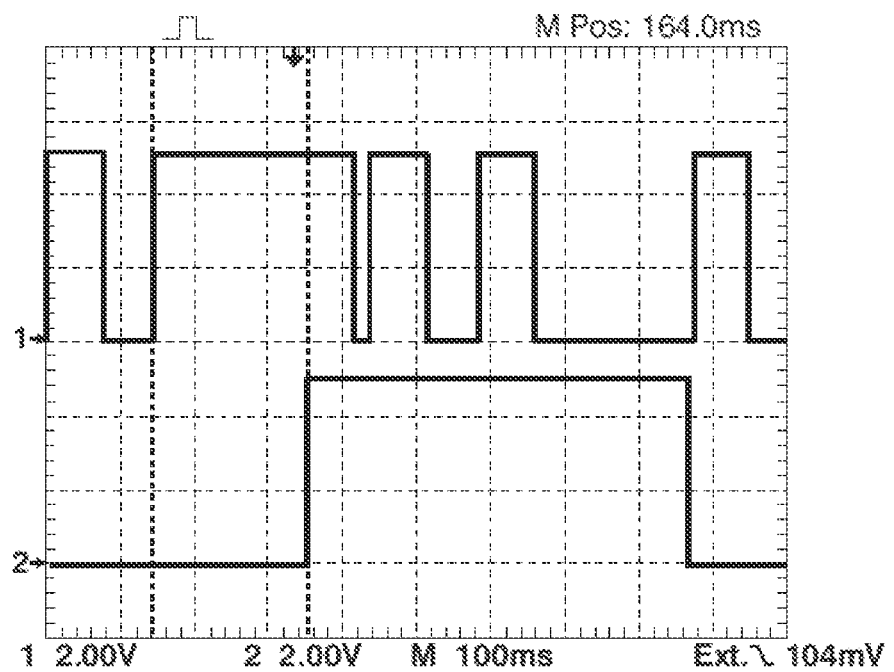
FIG. 9 shows an input signal with frequency instabilities more similar to that of the input signal and the corresponding consolidated signal

For the other state, FIG. 4 shows how the capacitor is charged every time there is a 0 (signal 1 in FIG. 4) at the input for consolidating state 1, preventing it from discharging to the trigger value (signal 3 in FIG. 4), and when it is below the trigger value, it changes the output to state 1 (signal 2 in FIG. 4).

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. A two-state discrete signal consolidation device, said device comprising:
    switching means controlled by the discrete signal,
    capacitive means for each state, said capacitive means connected to the switching means such that their charge is carried out when the other state is produced, and
    resistive means for each state, said resistive means connected to the switching means and to the capacitive means of the corresponding state, such that the corresponding capacitive means are discharged through them when the corresponding state is produced,
    stable state detection signal generating means for each state, said means adapted to generate a stable state detection signal in two excluding modes a) or b),
        mode a) being when the discharge level of the corresponding capacitive means reaches a detection level such that the discharge time necessary for reaching it is equal to or greater than the consolidation time of the corresponding state, and
        mode b) being when the charge level of the corresponding capacitive means reaches a detection level such that the charge time necessary for reaching it is equal to or greater than the consolidation time of the corresponding state,
    consolidated signal generating means adapted to generate a discrete signal the state of which corresponds to that of the last stable state detection signal generated in either of modes a) or b).

2. The device according to claim 1, wherein the switching means comprise one of a transistor and a diode for each state which conducts when the other state is produced.

3. The device according to claim 1, wherein the capacitive means comprise at least one capacitor.

4. The device according to claim 1, wherein the resistive means comprise at least one resistor.

5. The device according to claim 1, wherein the stable state detection signal generating means comprise a trigger and the stable state detection signal is a pulse.

6. The device according to claim 1, wherein the consolidated signal generating means comprise an S/R flip-flop.

7. The device according to claim 6, wherein the flip-flop comprises three NAND gates.

8. The device according to claim 7, wherein each trigger is integrated in a corresponding NAND gate of the flip-flop.

9. The device according to claim 1, wherein the detection level of each state is different.

10. The device according to claim 1, wherein the detection level of each state is the same.

11. An aircraft comprising at least one two-state discrete signal consolidation device according to claim 1.

12. A method for consolidating a two-state discrete signal, said method comprising the following steps:
    allowing the charge of capacitive means associated with one state when the opposite state is produced through switching means controlled by the discrete signal,
    allowing the discharge of said capacitive means through resistive means associated with said state when said state is active through said switching means,
    generating a stable state detection signal corresponding to one state either:
    when the discharge level of the capacitive means corresponding to said state reaches a detection level such that the discharge time necessary for reaching it is equal to or greater than the consolidation time of said state, or
    when the charge level of the capacitive means corresponding to said state reaches a detection level such that the charge time necessary for reaching it is equal to or greater than the consolidation time of said state, and generating a consolidated signal with a state corresponding to that of the last stable state detection signal generated.

13. The method according to claim 12, wherein the detection level of each state is different.

14. The method according to claim 12, wherein the detection level of each state is the same.

* * * * *